United States Patent
Koyanagi et al.

(10) Patent No.: US 11,552,214 B2
(45) Date of Patent: Jan. 10, 2023

(54) LIFT-OFF METHOD AND LASER PROCESSING APPARATUS

(71) Applicant: DISCO CORPORATION, Tokyo (JP)

(72) Inventors: Tasuku Koyanagi, Tokyo (JP); Junya Mimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 31 days.

(21) Appl. No.: 17/342,706

(22) Filed: Jun. 9, 2021

(65) Prior Publication Data

US 2021/0399163 A1    Dec. 23, 2021

(30) Foreign Application Priority Data

Jun. 18, 2020   (JP) .............................. JP2020-105642

(51) Int. Cl.
*H01L 33/00* (2010.01)

(52) U.S. Cl.
CPC ........ *H01L 33/0093* (2020.05); *H01L 33/007* (2013.01)

(58) Field of Classification Search
None
See application file for complete search history.

(56) References Cited

U.S. PATENT DOCUMENTS

| 2013/0017640 A1* | 1/2013 | Morikazu | .............. B23K 26/00 438/46 |
| 2019/0115494 A1* | 4/2019 | Koyanagi | ........... H01L 33/0093 |

FOREIGN PATENT DOCUMENTS

JP        2013229386 A    11/2013

* cited by examiner

*Primary Examiner* — Bradley Smith
(74) *Attorney, Agent, or Firm* — Greer Burns & Crain Ltd.

(57) ABSTRACT

A lift-off method includes a relocation substrate joining step of joining a relocation substrate to a surface of an optical device layer of an optical device wafer with a joining member interposed therebetween, thereby forming a composite substrate, a buffer layer breaking step of applying a pulsed laser beam having a wavelength transmittable through an epitaxy substrate and absorbable by a buffer layer to the buffer layer from a reverse side of the epitaxy substrate of the optical device wafer of the composite substrate, thereby breaking the buffer layer, and an optical device layer relocating step of peeling off the epitaxy substrate from the optical device layer, thereby relocating the optical device layer to the relocation substrate. In the buffer layer breaking step, irradiating conditions of the pulsed la-ser beam are changed for respective ring-shaped areas of the buffer layer, and the pulsed laser beam is applied to the optical device wafer under the changed irradiating conditions.

1 Claim, 13 Drawing Sheets

21, 21-1
21, 21-2

21, 21-3
21, 21-1
21, 21-2

LIFT-OFF METHOD AND LASER PROCESSING APPARATUS

BACKGROUND OF THE INVENTION

Field of the Invention

The present invention relates to a lift-off method and a laser processing apparatus.

Description of the Related Art

Composite substrates each include an optical device wafer and a relocation substrate that are joined to each other by a joining member interposed therebetween. The optical device wafer includes an optical device layer deposited on a surface of an epitaxy substrate with a buffer layer interposed therebetween, and the optical device layer is joined to the relocation substrate by the joining member. There has heretofore been practiced a lift-off method for relocating the optical device layer from the epitaxy substrate to the relocation substrate by applying a laser beam to the buffer layer to break the buffer layer (see, for example, JP 2013-229386A).

SUMMARY OF THE INVENTION

According to the lift-off method disclosed in JP 2013-229386A where the composite substrate is separated by the laser beam applied thereto, the composite substrate is liable to have a warp caused by the affixation of the optical device wafer to the relocation substrate etc.

When the laser beam is applied to the composite substrate, since the laser beam is applied differently to, i.e., focused differently onto, an outer circumferential portion and a central portion of the composite substrate, only the outer circumferential portion tends to be peeled off and the central portion tends to be not peeled off, and vice versa, failing to achieve desired processed results.

Furthermore, if the laser beam is additionally applied to the composite substrate in its entirety in order to accelerate the peeling-off of the unpeeled region, then the processing period is increased, and the portion that has already been peeled off is damaged, resulting in a reduction in the processing quality.

It is therefore an object of the present invention to provide a lift-off method and a laser processing apparatus which are capable of achieving desired processed results and preventing a reduction in the quality of processed products.

In accordance with an aspect of the present invention, there is provided a lift-off method for relocating an optical device layer of an optical device wafer in which the optical device layer is deposited on a face side of an epitaxy substrate with a buffer layer interposed therebetween to a relocation substrate. The lift-off method includes a relocation substrate joining step of joining the relocation substrate to a surface of the optical device layer of the optical device wafer with a joining member interposed therebetween to form a composite substrate, a buffer layer breaking step of applying a pulsed laser beam having a wavelength transmittable through the epitaxy substrate and absorbable by the buffer layer to the buffer layer from a reverse side of the epitaxy substrate of the optical device wafer of the composite substrate to break the buffer layer, and an optical device layer relocating step of, after the buffer layer breaking step has been carried out, peeling off the epitaxy substrate from the optical device layer to relocate the optical device layer to the relocation substrate. In the buffer layer breaking step, irradiating conditions of the pulsed laser beam are changed for respective ring-shaped areas of the buffer layer whose outside and inside diameters have been designated, and the pulsed laser beam is applied to the optical device wafer under the changed irradiating conditions.

In accordance with another aspect of the present invention, there is provided a laser processing apparatus for applying a laser beam to a buffer layer to break the buffer layer in a composite substrate in which an optical device layer of an optical device wafer is deposited on a face side of an epitaxy substrate with the buffer layer interposed therebetween and the optical device layer is joined to a relocation substrate by a joining member interposed therebetween. The laser processing apparatus includes a chuck table having a holding surface for holding the relocation substrate of the composite substrate, a laser beam applying unit for applying the laser beam to the buffer layer of the composite substrate held on the chuck table, and a control unit for controlling the laser beam applying unit. The control unit includes an irradiated area setting section for setting areas of the buffer layer that are to be irradiated by the laser beam by designating outside and inside diameters, the areas including at least one ring-shaped area.

The present invention is advantageous in that the lift-off method and the laser processing apparatus are capable of achieving desired processed results and preventing a reduction in the quality of processed products.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will hereinafter be described in detail below with reference to the drawings. The present invention is not limited to the details of the embodiment described below. The components described below cover those which could easily be anticipated by those skilled in the art and those which are essentially identical to those described above. Furthermore, the arrangements described below can be combined in appropriate manners. Various omissions, replacements, or changes of the arrangements may be made without departing from the scope of the present invention.

First Embodiment

Figure 1:
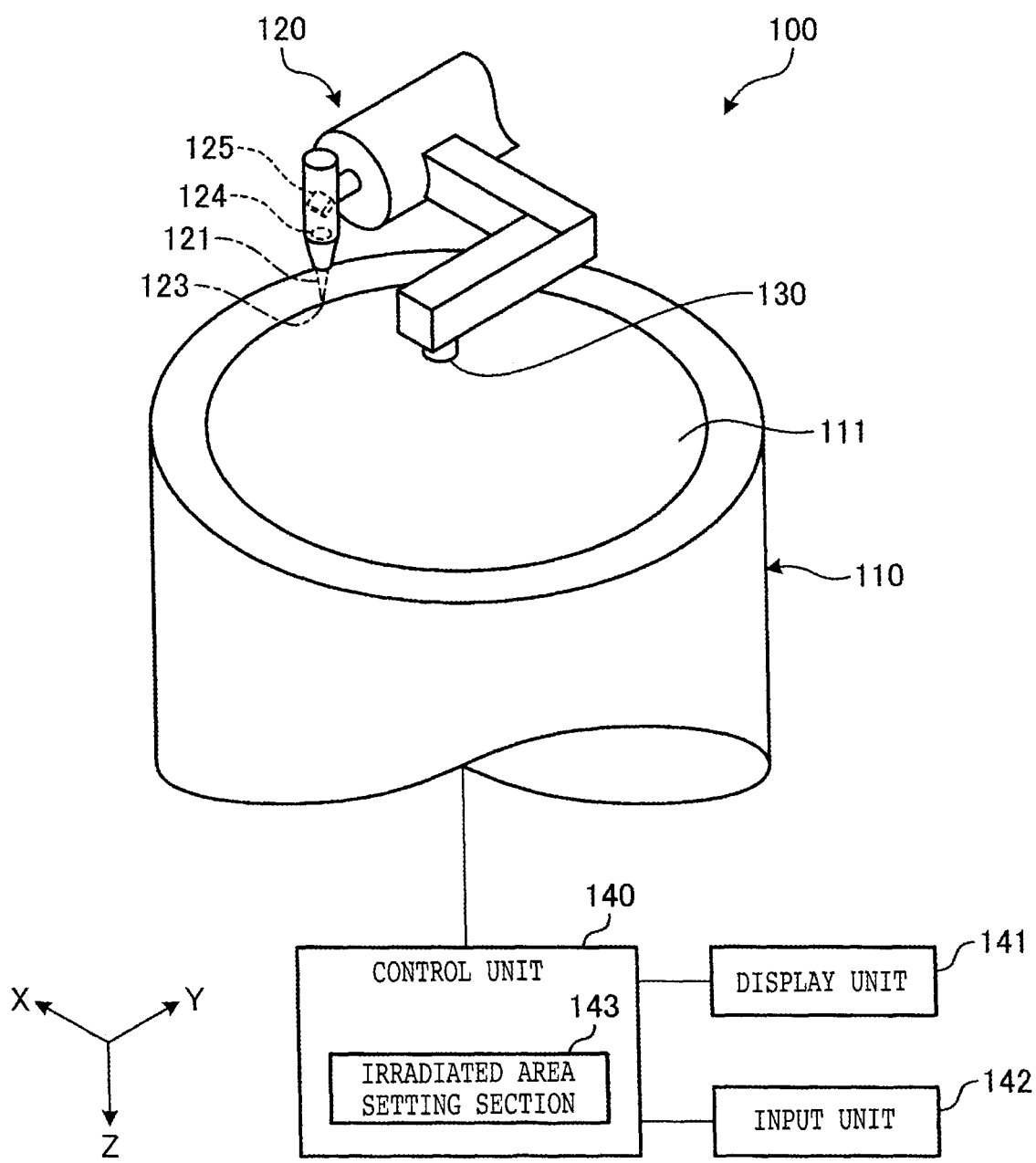
FIG. 1 is a perspective view of a central portion of a configurational example of a laser processing apparatus according to a first embodiment of the present invention.

First, a laser processing apparatus according to a first embodiment of the present invention will be described below. FIG. 1 illustrates in perspective a central portion of a configurational example of a laser processing apparatus 100 according to a first embodiment of the present invention. The laser processing apparatus 100 illustrated in FIG. 1 is an apparatus for breaking a buffer layer 6 of a composite substrate 1 illustrated in FIGS. 2 and 3.

(Composite Substrate)

Figure 2:
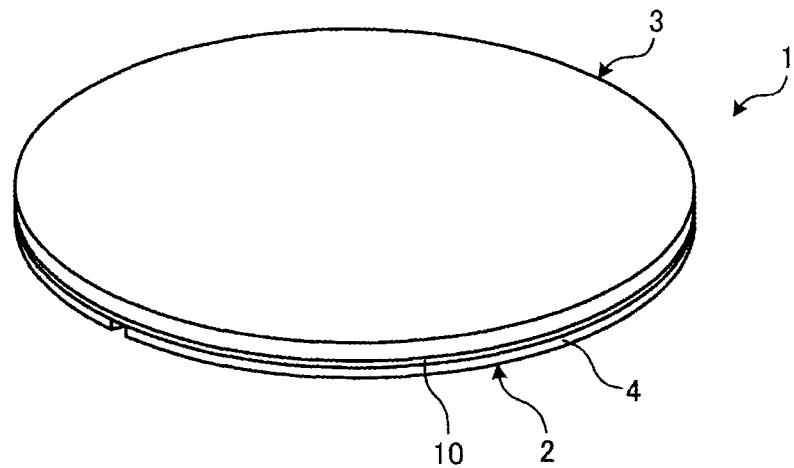
FIG. 2 is a perspective view of a composite substrate as an object to be processed by the laser processing apparatus illustrated in FIG. 1.
Figure 4:
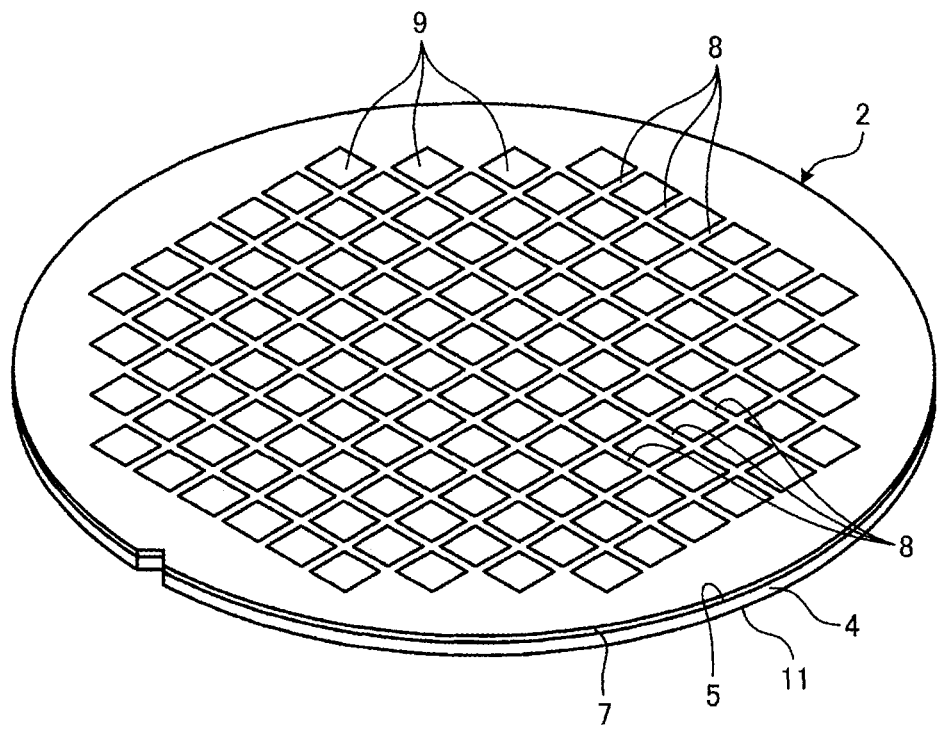
FIG. 4 is a perspective view of an optical device wafer of the composite substrate illustrated in FIG. 2.
Figure 5:
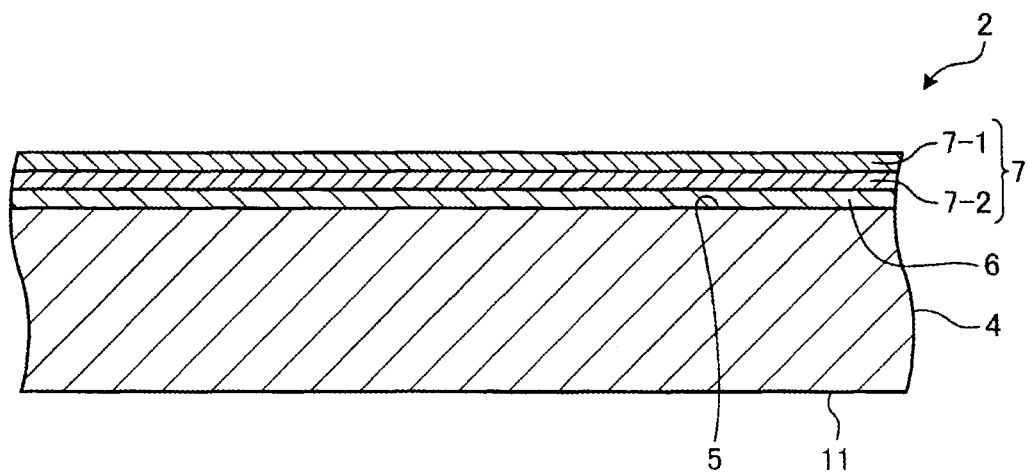
FIG. 5 is an enlarged fragmentary cross-sectional view of a central portion of the optical device wafer illustrated in FIG. 4.

The composite substrate 1 will be described below. FIG. 2 illustrates in perspective the composite substrate 1 as an object to be processed by the laser processing apparatus 100 illustrated in FIG. 1. FIG. 4 illustrates in perspective an optical device wafer 2 of the composite substrate 1 illustrated in FIG. 2. FIG. 5 illustrates in enlarged fragmentary cross section a central portion of the optical device wafer 2 illustrated in FIG. 4. In FIG. 4, optical devices 9 formed on the optical device wafer 2 are schematically illustrated as scaled up for illustrative purposes.

Figure 3:
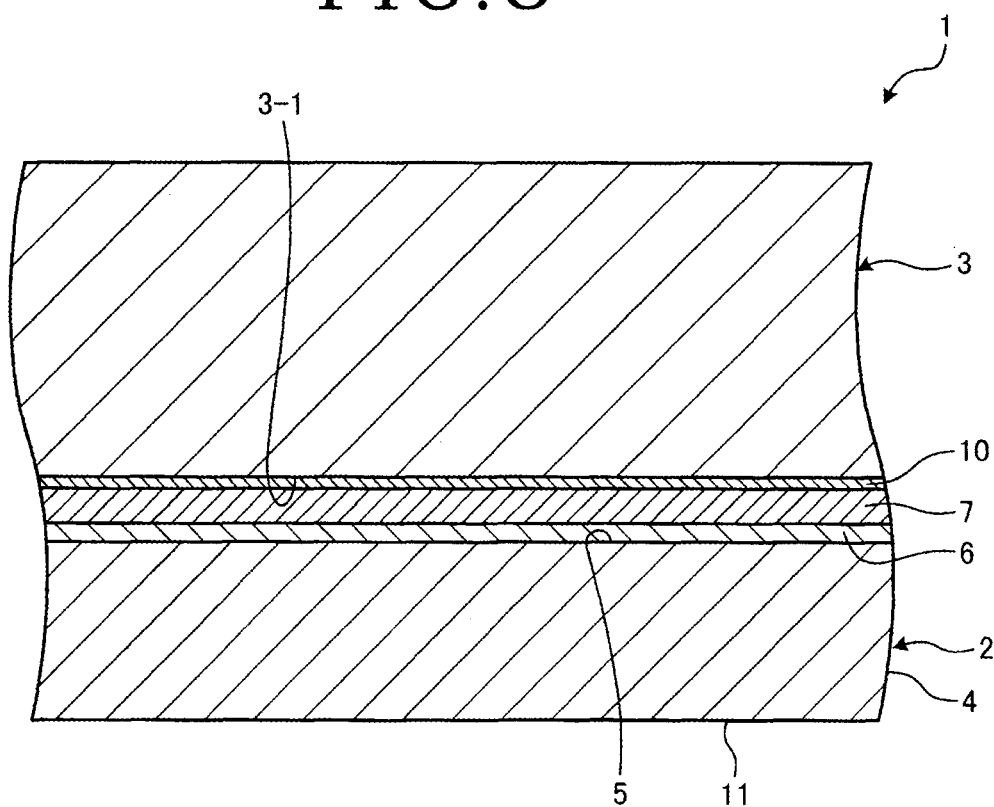
FIG. 3 is an enlarged fragmentary cross-sectional view of the composite substrate illustrated in FIG. 2.

As illustrated in FIGS. 2 and 3, the composite substrate 1 includes the optical device wafer 2 and a relocation substrate 3. As illustrated in FIGS. 2, 3, 4, and 5, the optical device wafer 2 includes an epitaxy substrate 4. The optical device wafer 2 also includes an optical device layer 7 deposited on a face side 5 of the epitaxy substrate 4 with a buffer layer 6 interposed therebetween.

According to the first embodiment, the epitaxy substrate 4 includes a substrate of sapphire shaped as a circular plate having an outside diameter of approximately 100 mm and a thickness ranging from 1.2 to 1.5 mm. According to the first embodiment, as illustrated in FIG. 5, the optical device layer 7 includes an n-type gallium nitride semiconductor layer 7-1 and a p-type gallium nitride semiconductor layer 7-2 that are grown to a total thickness of approximately 6 µm on the face side 5 of the epitaxy substrate 4 by way of the epitaxial growth method. The optical device layer 7 may be used as light-emitting diodes (LEDs), for example. According to the first embodiment, the buffer layer 6 includes a layer of gallium nitride (GaN) having a thickness of approximately 1 µm, formed between the face side 5 of the epitaxy substrate 4 and the p-type gallium nitride semiconductor layer 7-2 of the optical device layer 7 when the optical device layer 7 is deposited on the epitaxy substrate 4.

According to the first embodiment, as illustrated in FIG. 4, the optical device layer 7 includes a plurality of the optical devices 9 formed in respective areas demarcated thereon by a grid of intersecting streets 8. According to the first embodiment, the distance between adjacent ones of the optical devices 9, i.e., the width of the streets 8, is approximately 5 µm. The epitaxy layer 4 may be a CMOS (Complementary Metal Oxide Semiconductor) wafer.

The relocation substrate 3 is shaped as a circular plate having an outside diameter equal to the outside diameter of the epitaxy substrate 4. According to the first embodiment, the relocation substrate 3 is approximately as thick as the epitaxy substrate 4 and is made of silicon. According to the present invention, however, the relocation substrate 3 may be made of copper alloy, molybdenum, glass, or the like, rather than silicon.

The relocation substrate 3 has a surface 3-1 to which an adhesive is applied to form a joining member 10 thereon. The adhesive that makes up the joining member 10 preferably includes an organic compound, e.g., a glue for use in adhesive tapes. The adhesive may have such properties that when heated, it is softened to lower its viscosity, and when further heated or irradiated with ultraviolet rays, a chemical reaction such as a hardening reaction or the like occurs in the adhesive, hardening the adhesive to further lower its viscosity. Alternatively, the joining member 10 may be made of metal such as gold, platinum, chromium, indium, palladium, or the like.

The joining member 10 deposited on the surface 3-1 of the relocation substrate 3 is joined to the optical device layer 7 of the optical devices 9, forming the composite substrate 1. In other words, the composite substrate 1 is formed by joining the optical device layer 7 of the optical device wafer 2 to the relocation substrate 3 with the joining member 10.

(Laser Processing Apparatus)

The laser processing apparatus 100 (see FIG. 1) is an apparatus for breaking the buffer layer 6 of the composite substrate 1 by applying a pulsed laser beam 121 to the buffer layer 6. As illustrated in FIG. 1, the laser processing apparatus 100 has a chuck table 110 having a holding surface 111 for holding the relocation substrate 3 of the composite substrate 1 thereon, a laser beam applying unit 120, a moving assembly, not illustrated, an image capturing unit 130, and a control unit 140.

The chuck table 110 holds the composite substrate 1 on the holding surface 111. The holding surface 111 is of a disk shape and made of porous ceramic or the like, and is connected to a vacuum suction source, not illustrated, through a vacuum suction channel, not illustrated. The chuck table 110 holds under suction the composite substrate 1 placed on the holding surface 111 due to vacuum forces generated by the vacuum suction source and transmitted through the vacuum suction channel. According to the first embodiment, the holding surface 111 includes a flat surface lying parallel to horizontal directions represented by X-axis directions and Y-axis directions illustrated in FIG. 1.

The chuck table 110 is rotatable about an axis perpendicular to the holding surface 111 and parallel to Z-axis directions parallel to vertical directions by a rotating unit as part of the moving assembly. The chuck table 110 is also movable together with the rotating unit in the X-axis directions parallel to horizontal directions by an X-axis moving unit as part of the moving assembly and in the Y-axis directions parallel to the horizontal directions and perpendicular to the X-axis directions by a Y-axis moving unit as part of the moving assembly.

The laser beam applying unit 120 is a unit for applying the pulsed laser beam 121 to the buffer layer 6 of the composite substrate 1 held on the chuck table 110. According to the first embodiment, the pulsed laser beam 121 applied to the buffer layer 6 by the laser beam applying unit 120 has a wavelength transmittable through the epitaxy substrate 4 of the composite substrate 1 and absorbable by the buffer layer 6 thereof. Part of the laser beam applying unit 120 is movably supported for movement in the Z-axis directions by a Z-axis moving unit as part of the moving assembly.

Figure 9:
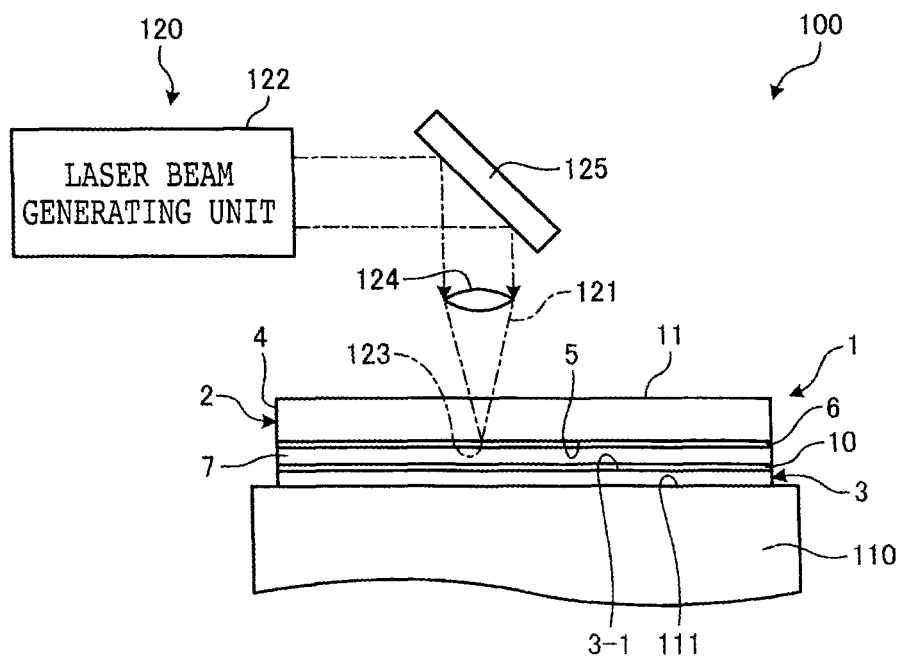
FIG. 9 is a side elevational view schematically illustrating the buffer layer breaking step of the lift-off method illustrated in FIG. 6.

The laser beam applying unit 120 includes a laser beam generating unit 122 illustrated in FIG. 9 for generating and emitting the pulsed laser beam 121 whose wavelength is transmittable through the epitaxy substrate 4 and absorbable by the buffer layer 6, a condensing lens 124 for positioning a focused spot 123 of the pulsed laser beam 121 emitted by the laser beam generating unit 122 in the buffer layer 6 and applying the pulsed laser beam 121 to the composite substrate 1 held on the holding surface 111 of the chuck table 110, and a mirror 125 disposed on an optical path of the pulsed laser beam 121 between the laser beam generating unit 122 and the condensing lens 124.

The condensing lens 124 is disposed in a position facing the holding surface 111 of the chuck table 110 along the Z-axis directions, and transmits the pulsed laser beam 121 emitted by the laser beam generating unit 122 therethrough and focuses the pulsed laser beam 121 into the focused spot 211.

The mirror 125 reflects the pulsed laser beam 121 emitted by the laser beam generating unit 122 toward the composite substrate 1. According to the first embodiment, the mirror 125 includes a galvanomirror or the like and is able to adjust the angle through which the pulsed laser beam 121 is reflected thereby. The mirror 125 can scan the pulsed laser beam 121 in order to allow the condensing lens 124 to focus the pulsed laser beam 121 at any desired position in horizontal directions in the buffer layer 6. According to the first embodiment, the mirror 125 scans the pulsed laser beam 121 such that the focused spot 123 of the pulsed laser beam 121 follows a spiral locus from an outermost circumferential edge of the epitaxy substrate 4 toward the center thereof. In this manner, the laser beam applying unit 120 applies the pulsed laser beam 121 to the entire surface of the buffer layer 13.

The moving assembly moves the laser beam applying unit 120 and the chuck table 110 relatively to each other along the X-axis directions, the Y-axis directions, and the Z-axis directions, and also about the axis parallel to the Z-axis directions. The X-axis directions and the Y-axis directions extend parallel to the holding surface 111. The moving assembly includes the X-axis moving unit as a processing feed unit for moving the chuck table 110 along the X-axis directions, the Y-axis moving unit as an indexing feed unit for moving the chuck table 110 along the Y-axis directions, the Z-axis moving unit for moving the condensing lens 124 of the laser beam applying unit 120 along the Z-axis directions, and the rotating unit for rotating the chuck table 110 about the axis parallel to the Z-axis directions.

The laser processing apparatus 100 further includes an X-axis position detecting unit, not illustrated, for detecting the position of the chuck table 110 in the X-axis directions, a Y-axis position detecting unit, not illustrated, for detecting the position of the chuck table 110 in the Y-axis directions, and a Z-axis position detecting unit, not illustrated, for detecting the position of the condensing lens 124 of the laser beam applying unit 120 in the Z-axis directions. Each of the X-, Y-, and Z-axis position detecting units outputs the detected result or position to the control unit 140.

The image capturing unit 130 captures an image of the composite substrate 1 held on the chuck table 110. The image capturing unit 130 includes an image capturing device such as a charge-coupled device (CCD), a complementary MOS (CMOS) image sensor, or the like that captures an image of the composite substrate 1 held on the chuck table 110. According to the first embodiment, the image capturing unit 130 is mounted on the distal end of a casing of the laser beam applying unit 120 and disposed in a position juxtaposed with the condensing lens 124 of the laser beam applying unit 120 in the X-axis directions. The image capturing unit 130 captures an image of the composite substrate 1 for use in an alignment process for positioning the composite substrate 1 and the laser beam applying unit 120, and outputs the captured image to the control unit 140.

The control unit 140 controls the components described above of the laser processing apparatus 100 to enable the laser processing apparatus 100 to process a workpiece 200, i.e., the composite substrate 1. The control unit 140 is implemented by a computer, for example, including an arithmetic processing device having a microprocessor such as a central processing unit (CPU), a storage unit having a memory such as a read only memory (ROM) or a random access memory (RAM), and an input/output interface device. The arithmetic processing device of the control unit 140 performs arithmetic processing operations according to computer programs stored in the storage unit and outputs control signals for controlling the laser processing apparatus 100 through the input/output interface device to the above components of the laser processing apparatus 100.

To the control unit 140, there are connected a display unit 141 such as a liquid crystal display device or the like for displaying processing operation states, images, etc. and an input unit 142 to be used for an operator to register processing content information etc. The input unit 142 includes at least one of a touch panel on the display unit 141 and an external input device such as a keyboard etc.

The control unit 140 has an irradiated area setting section 143. The irradiated area setting section 143 stores irradiating conditions set for respective ring-shaped areas 21, illustrated in FIG. 8, of the buffer layer 6 of the composite substrate 1. When the irradiated area setting section 143 receives inside diameters 23 and outside diameters 22 entered from the input unit 142 etc., the irradiated area setting section 143 sets ring-shaped areas 21 of the buffer layer 6 that are determined by the inside diameters 23 and the outside diameters 22. The irradiated area setting section 143 stores irradiating conditions entered from the input unit 142 and the inside diameters 23 and the outside diameters 22 of the ring-shaped areas 21 in association with each other. According to the first embodiment, the irradiating conditions represent the output power level, index, and defocus of the pulsed laser beam 121. According to the present invention, however, the irradiating conditions are not limited to those parameters. The irradiated area setting section 143 thus sets at least one ring-shaped area 21 as an area to be irradiated with the pulsed laser beam 121 by designating the inside diameters 23 and the outside diameters 22. According to the first embodiment, the functions of the irradiated area setting section 143 are realized by the storage unit referred to above.

Figure 6:
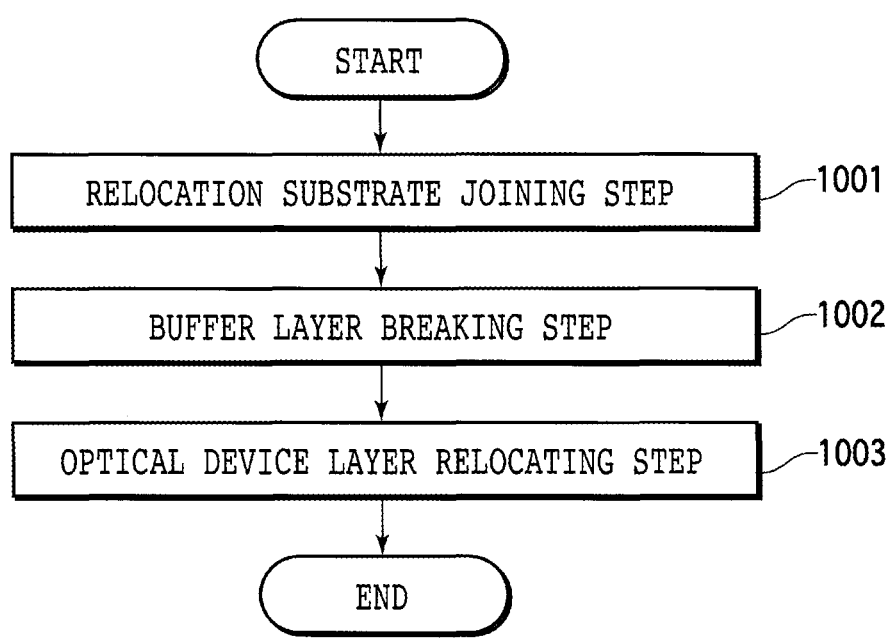
FIG. 6 is a flowchart of the sequence of a lift-off method according to the first embodiment.

Next, a lift-off method according to the first embodiment will be described below. FIG. 6 is a flowchart of the sequence of the lift-off method according to the first embodiment. The lift-off method according to the first embodiment refers to a method of relocating the optical device layer 7 of the optical device wafer 2 from the epitaxy substrate 4 to the relocation substrate 3. As illustrated in FIG. 6, the lift-off method according to the first embodiment includes a relocation substrate joining step 1001, a buffer layer breaking step 1002, and an optical device layer relocating step 1003.

(Relocation Substrate Joining Step)

Figure 7:
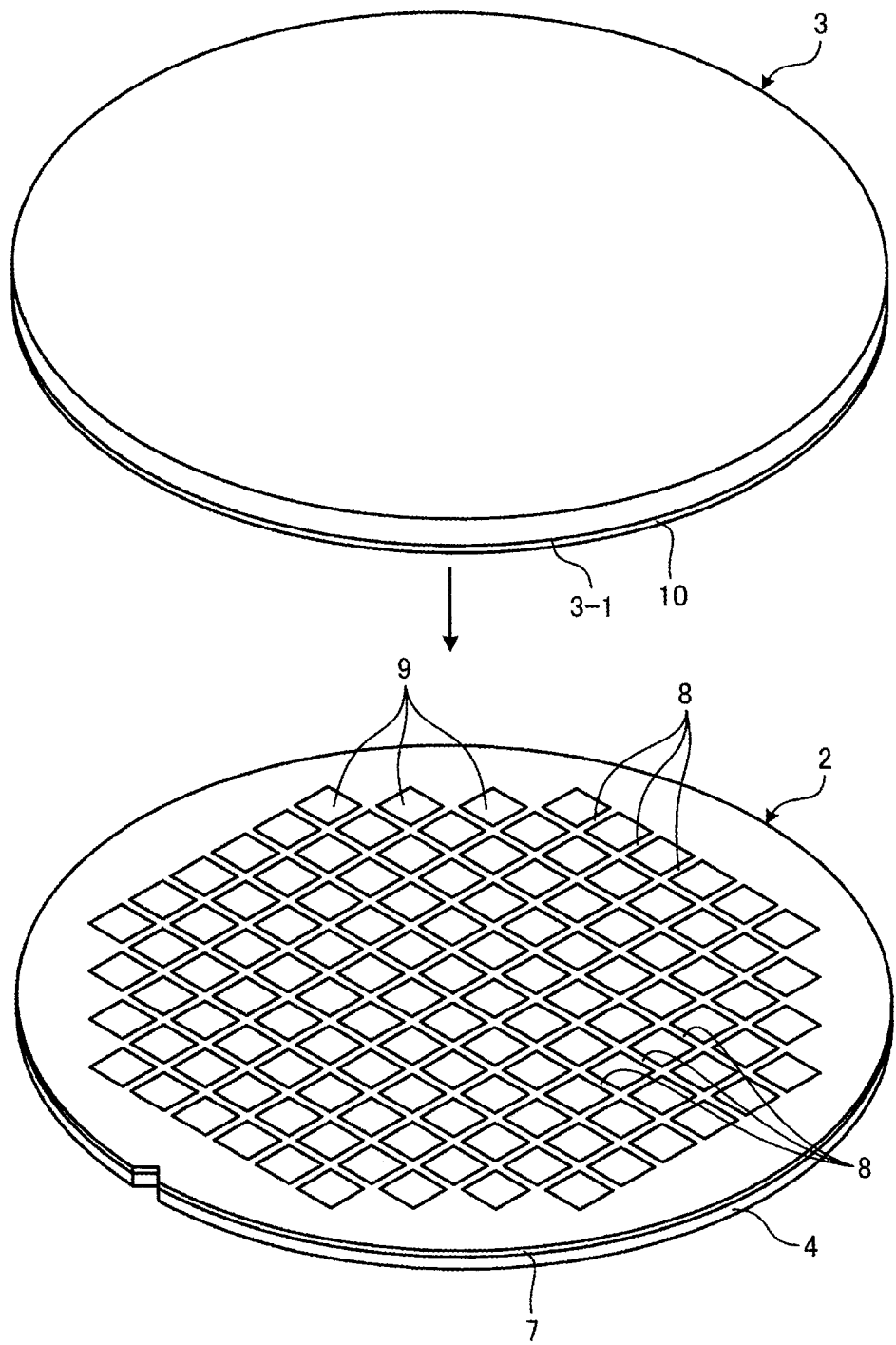
FIG. 7 is a perspective view of an optical device layer of the optical device wafer and a relocation substrate that are disposed in confronting relation to each other in a relocation substrate joining step of the lift-off method illustrated in FIG. 5.

FIG. 7 illustrates in perspective the optical device layer 7 of the optical device wafer 2 and the relocation substrate 3 that are disposed in confronting relation to each other in the relocation substrate joining step 1001 of the lift-off method illustrated in FIG. 5. The relocation substrate joining step 1001 is a step of joining the relocation substrate 3 to the surface of the optical device layer 7 of the optical device wafer 2 with the joining member 10, thereby forming the composite substrate 1.

In the relocation substrate joining step 1001, the surface 3-1 of the relocation substrate 3 is coated with an adhesive to form the joining member 10 on the surface 3-1. In the relocation substrate joining step 1001, then, as illustrated in FIG. 7, the optical device layer 7 of the optical device wafer 2 and the joining member 10 formed on the surface 3-1 of the relocation substrate 3 are disposed in facing relation to each other, and brought closely together until the joining member 10 contacts the optical device layer 7. In the relocation substrate joining step 1001, thereafter, the optical device wafer 2 and the relocation substrate 3 are pressed against each other to join the relocation substrate 3 to the surface of the optical device layer 7 with the joining member 10, thereby forming the composite substrate 1 illustrated in FIGS. 2 and 3.

(Buffer Layer Breaking Step)

Figure 8:
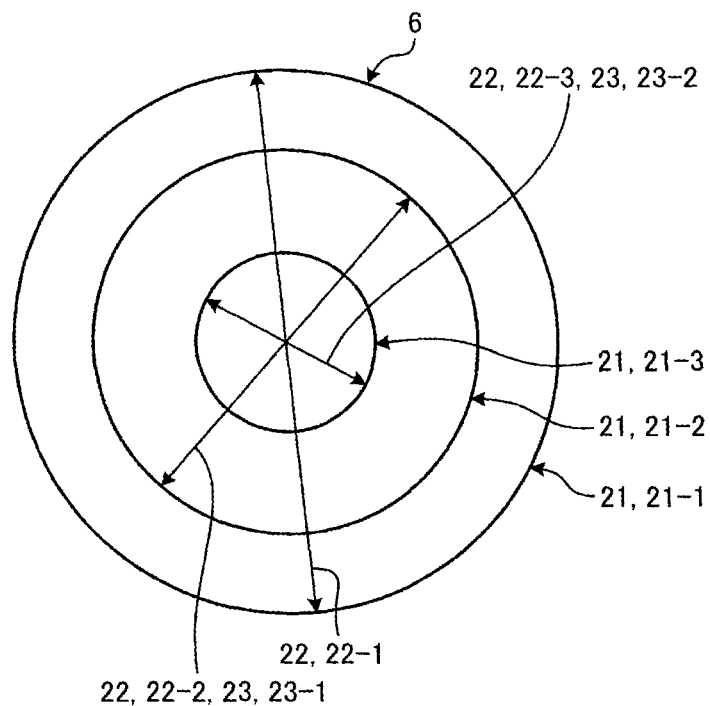
FIG. 8 is a plan view of ring-shaped areas of a buffer layer set in an irradiated area setting section of the laser processing apparatus that carries out a buffer layer breaking step of the lift-off method illustrated in FIG. 6.
Figure 10:
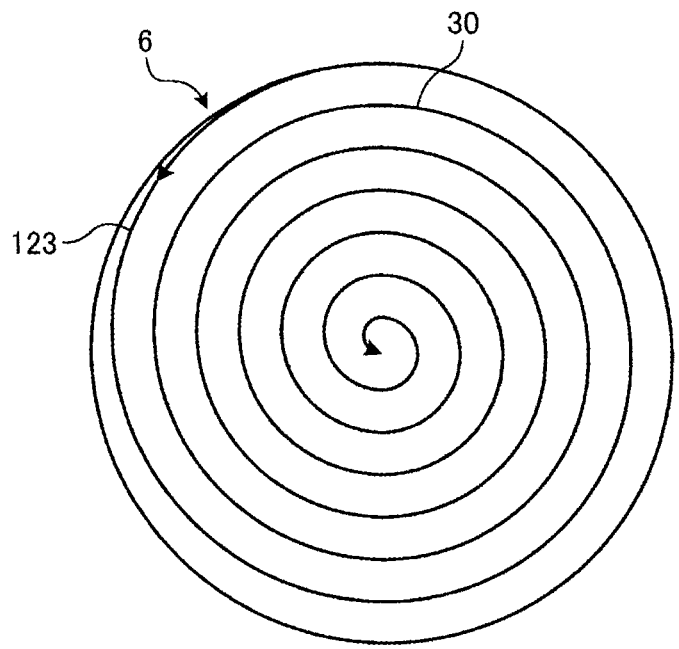
FIG. 10 is a plan view illustrating the locus of a focused spot of a laser beam in the buffer layer breaking step of the lift-off method illustrated in FIG. 6.
Figure 11:
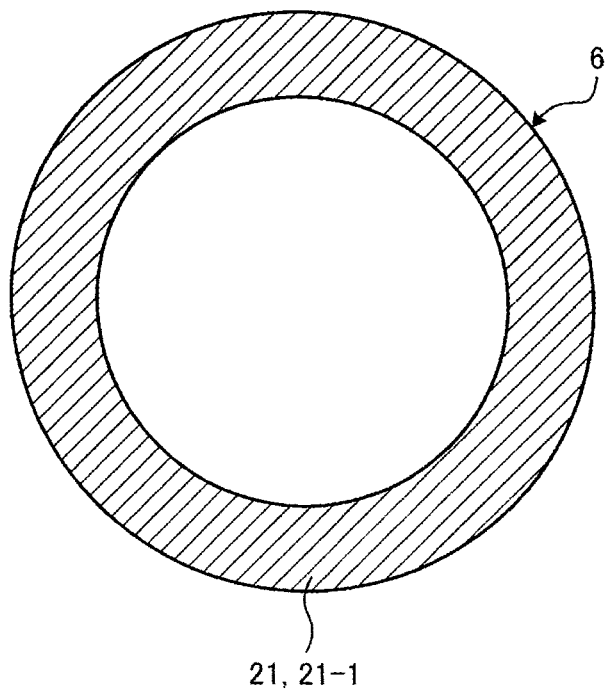
FIG. 11 is a plan view illustrating the manner in which the laser beam is applied to a first area of the buffer layer in the buffer layer breaking step of the lift-off method illustrated in FIG. 6.
Figure 12:
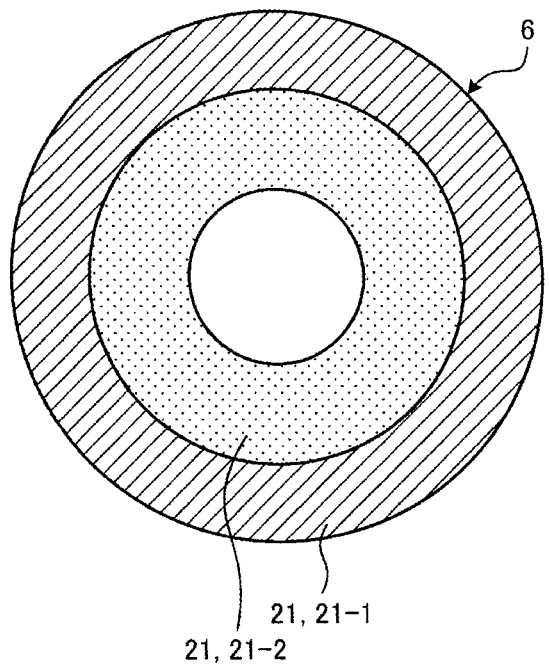
FIG. 12 is a plan view illustrating the manner in which the laser beam is applied to a second area of the buffer layer in the buffer layer breaking step of the lift-off method illustrated in FIG. 6.
Figure 13:
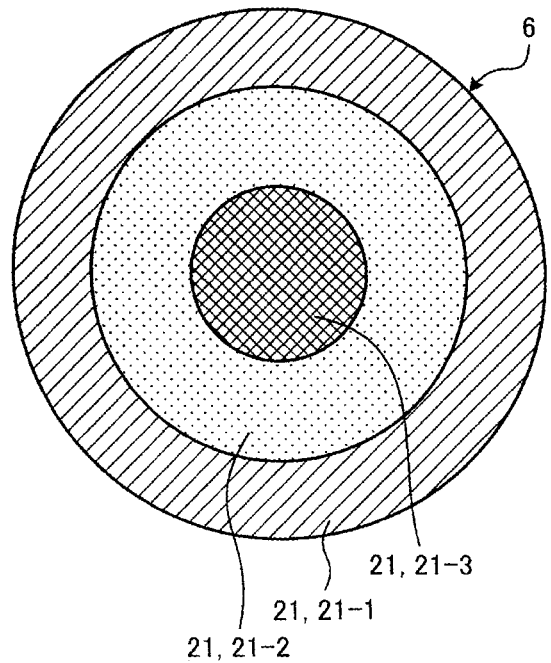
FIG. 13 is a plan view illustrating the manner in which the laser beam is applied to a third area of the buffer layer in the buffer layer breaking step of the lift-off method illustrated in FIG. 6.

FIG. 8 illustrates in plan ring-shaped areas of the buffer layer 6 set in the irradiated area setting section 143 of the laser processing apparatus 100 that carries out the buffer layer breaking step 1002 of the lift-off method illustrated in FIG. 6. FIG. 9 schematically illustrates in side elevation the buffer layer breaking step 1002 of the lift-off method illustrated in FIG. 6. FIG. 10 illustrates in plan locus of the focused spot 123 of the laser beam on the buffer layer 6 in the buffer layer breaking step 1002 of the lift-off method illustrated in FIG. 6. FIG. 11 illustrates in plan the manner in which the laser beam is applied to a first area of the buffer layer 6 in the buffer layer breaking step 1002 of the lift-off method illustrated in FIG. 6. FIG. 12 illustrates in plan the manner in which the laser beam is applied to a second area of the buffer layer 6 in the buffer layer breaking step 1002 of the lift-off method illustrated in FIG. 6. FIG. 13 illustrates in plan the manner in which the laser beam is applied to a third area of the buffer layer 6 in the buffer layer breaking step 1002 of the lift-off method illustrated in FIG. 6.

The buffer layer breaking step 1002 is a step of breaking the buffer layer 6 by applying a pulsed laser beam having a wavelength transmittable through the epitaxy substrate 4 of the optical device wafer 2 of the composite substrate 1 and absorbable by the buffer layer 6 to the composite substrate 1 from a reverse side 11 of the epitaxy substrate 4 that is opposite the face side 5 thereof.

In the buffer layer breaking step 1002, the operator operates the input unit 142, for example, to enter processing content information into the control unit 140. According to the first embodiment, information indicating the execution of an entire area irradiating step of applying the pulsed laser beam 121 under identical irradiating conditions to the buffer layer 6 in its entirety of the composite substrate 1 and an area irradiating step of applying the pulsed laser beam 121 under different irradiating conditions to a plurality of the ring-shaped areas 21 of the buffer layer 6 is entered as the processing content information into the control unit 140, and the control unit 140 receives the entered information and stores the received information in the irradiated area setting section 143.

In the buffer layer breaking step 1002, furthermore, when the processing content information is set, irradiating conditions for the entire area irradiating step are entered into the control unit 140, and the control unit 140 receives the entered irradiating conditions and stores the received irradiating conditions as associated with the entire area irradiating step in the irradiated area setting section 143. According to the first embodiment, the irradiating conditions for the entire area irradiating step represent the output power level of the pulsed laser beam 121 in the range from 3 to 10 μJ (microjoule), the index of the pulsed laser beam 121 in the range from 10 to 20 μm (micrometer), and the defocus of the pulsed laser beam 121 in the range from 0 to 2.0 mm, for example.

In the buffer layer breaking step 1002, moreover, when the processing content information is set, outside diameters 22 and inside diameters 23 representing information of the ring-shaped areas 21 of the buffer layer 6 that have different irradiating conditions in the area irradiating step and the irradiating conditions are entered into the control unit 140, and the control unit 140 receives the outside diameters 22 and inside diameters 23 and the irradiating conditions and stores the areas 21 determined by the received outside diameters 22 and inside diameters 23 as associated with the irradiating conditions in the irradiated area setting section 143.

According to the first embodiment, as illustrated in FIG. 8, an outside diameter 22 (hereinafter denoted by 22-1) of the buffer layer 6 and a first inside diameter 23 (corresponding to an inside diameter and hereinafter denoted by 23-1) smaller than the outside diameter 22-1 of the buffer layer 6 are entered as information of an area 21 in the area irradiating step into the control unit 140, and a ring-shaped area 21 (hereinafter referred to as "first area 21-1") defined between the outside diameter 22-1 and the first inside diameter 23-1 is set in the irradiated area setting section 143 of the control unit 140. According to the first embodiment, the outside diameter 22-1 of the buffer layer 6 is 101.6 mm, for example, and the first inside diameter 23-1 is 67.8 mm, for example.

The operator operates the input unit 142, for example, to enter irradiating conditions for the first area 21-1 in the area irradiating step into the control unit 140, and the control unit 140 receives the entered irradiating conditions and stores the received irradiating conditions as associated with the outside diameter 22-1 and first inside diameter 23-1 of the first area 21-1 in the irradiated area setting section 143. According to the first embodiment, the irradiating conditions for the first area 21-1 represent the output power level of the pulsed laser beam 121 in the range from 2 to 8 µJ (microjoule), the index of the pulsed laser beam 121 in the range from 10 to 20 µm (micrometer), and the defocus of the pulsed laser beam 121 in the range from 0 to 3.0 mm, for example.

According to the first embodiment, a second outside diameter 22 (corresponding to an outside diameter and hereinafter denoted by 22-2) equal to the first inside diameter 23-1 and a second inside diameter 23 (corresponding to an inside diameter and hereinafter denoted by 23-2) smaller than the second outside diameter 22-2 are entered as information of an area 21 in the area irradiating step into the control unit 140, and a ring-shaped area 21 (hereinafter referred to as "second area 21-2") defined between the second outside diameter 22-2 and the second inside diameter 23-2 is set in the irradiated area setting section 143 of the control unit 140. According to the first embodiment, the second outside diameter 22-2 is 67.8 mm, for example, and the second inside diameter 23-2 is 33.8 mm, for example.

The operator operates the input unit 142, for example, to enter irradiating conditions for the second area 21-2 in the area irradiating step into the control unit 140, and the control unit 140 receives the entered irradiating conditions and stores the received irradiating conditions as associated with the second outside diameter 22-2 and second inside diameter 23-2 of the second area 21-2 in the irradiated area setting section 143. According to the first embodiment, the irradiating conditions for the second area 21-2 represent the output power level of the pulsed laser beam 121 in the range from 2 to 6 µJ (microjoule), the index of the pulsed laser beam 121 in the range from 10 to 20 µm (micrometer), and the defocus of the pulsed laser beam 121 in the range from 0 to 3.0 mm, for example.

According to the first embodiment, a third outside diameter 22 (corresponding to an outside diameter and hereinafter denoted by 22-3) equal to the second inside diameter 23-2 and a third inside diameter (corresponding to an inside diameter) smaller than the third outside diameter 22-3 are entered as information of an area 21 in the area irradiating step into the control unit 140, and a circular area 21 (hereinafter referred to as "third area 21-3") defined by the third outside diameter 22-3 is set in the irradiated area setting section 143 of the control unit 140. According to the first embodiment, the third outside diameter 22-3 is 33.8 mm, for example, and the third inside diameter is 0 mm, for example. In the present description, the third area 21-3 is represented by a ring-shaped area whose inside diameter is zero.

The operator operates the input unit 142, for example, to enter irradiating conditions for the third area 21-3 in the area irradiating step into the control unit 140, and the control unit 140 receives the entered irradiating conditions and stores the received irradiating conditions as associated with the third outside diameter 22-3 of the third area 21-3 in the irradiated area setting section 143. According to the first embodiment, the irradiating conditions for the third area 21-3 represent the output power level of the pulsed laser beam 121 in the range from 1 to 5 µJ (microjoule), the index of the pulsed laser beam 121 in the range from 10 to 20 µm (micrometer), and the defocus of the pulsed laser beam 121 in the range from 0 to 3.0 mm, for example.

According to the first embodiment, the output power level of the pulsed laser beam 121 etc. of the irradiating conditions for the second area 21-2 is lower than the output power level of the pulsed laser beam 121 of the irradiating conditions for the first area 21-1 in the area irradiating step of the buffer layer breaking step 1002, and the output power level of the pulsed laser beam 121 etc. of the irradiating conditions for the third area 21-3 is lower than the output power level of the pulsed laser beam 121 of the irradiating conditions for the second area 21-2 in the area irradiating step. According to the first embodiment, therefore, the output power level of the pulsed laser beam 121 etc. of the irradiating conditions for the radially inward areas 21-2 and 21-3 is lower than the output power level of the pulsed laser beam 121 of the irradiating conditions for the radially outer areas 21-1 and 21-2 in the area irradiating step of the buffer layer breaking step 1002.

In the buffer layer breaking step 1002, the relocation substrate 3 of the composite substrate 1 is placed on the holding surface 111 of the chuck table 110, and the control unit 140 actuates the vacuum suction source to enable the laser processing apparatus 100 to hold the relocation substrate 3 of the composite substrate 1 under suction on the holding surface 111 of the chuck table 110. In the buffer layer breaking step 1002, the control unit 140 sets the focused spot 123 of the pulsed laser beam 121 on the buffer layer 6 of the composite substrate 1 held on the chuck table 110, and the laser processing apparatus 100 applies the pulsed laser beam 121 emitted from the laser beam applying unit 120 to the buffer layer 6 from the reverse side 11 of the epitaxy substrate 4.

In the buffer layer breaking step 1002, the control unit 140 applies the pulsed laser beam 121 to the buffer layer 6 according to the processing content information. In the buffer layer breaking step 1002, furthermore, the control unit 140 controls the mirror 125 to scan the pulsed laser beam 121 under the set irradiating conditions in the entire area irradiating step as illustrated in FIG. 10 to initially position the focused spot 123 at the outermost circumferential edge of the epitaxy substrate 4 and then move the focused spot 123 on and along a spiral path 30, illustrated in FIG. 10, from the outermost circumferential edge of the epitaxy substrate 4 toward the center thereof.

In the buffer layer breaking step 1002, after the entire area irradiating step, the control unit 140 controls the mirror 125 to scan the pulsed laser beam 121 to initially position the focused spot 123 at the outermost circumferential edge of the epitaxy substrate 4 and then move the focused spot 123 on and along the spiral path 30 in the area irradiating step. In the buffer layer breaking step 1002, the laser processing apparatus 100 scans the pulsed laser beam 121 under the irradiating conditions for the first area 21-1 set in the irradiated area setting section 143 to apply the pulsed laser beam 121 to the first area 21-1 of the buffer layer 6 that is hatched in FIG. 11 in the area irradiating step.

In the buffer layer breaking step 1002, after having applied the pulsed laser beam 121 to the first area 21-1 of the buffer layer 6, the laser processing apparatus 100 scans the pulsed laser beam 121 under the irradiating conditions for the second area 21-2 set in the irradiated area setting section 143 to apply the pulsed laser beam 121 to the second area 21-2 of the buffer layer 6 that is stippled in FIG. 12 in the area irradiating step. In the buffer layer breaking step 1002, after having applied the pulsed laser beam 121 to the second area 21-2 of the buffer layer 6, the laser processing apparatus 100 scans the pulsed laser beam 121 under the irradiating conditions for the third area 21-3 set in the irradiated area setting section 143 to apply the pulsed laser beam 121 to the third area 21-3 of the buffer layer 6 that is cross-hatched in FIG. 13 in the area irradiating step.

In the buffer layer breaking step 1002, therefore, after the entire area irradiating step, the control unit 140 scans the pulsed laser beam 121 to move the focused spot 123 on and along the spiral path 30, and changes the irradiating conditions with respect to the pulsed laser beam 121 to the irradiating conditions for the areas 21-1, 21-2, and 21-3 set in the irradiated area setting section 143 while the pulsed laser beam 121 is being scanned. In the buffer layer breaking step 1002, consequently, the control unit 140 changes the irradiating conditions with respect to the pulsed laser beam 121 for each of the ring-shaped first and second areas 21-1 and 21-2 whose outside diameters 22-1 and 22-3 and inside diameters 23-1 and 23-2 have been designated and the circular third area 21-3 whose outside diameter 22-3 has been designated, and applies the pulsed laser beam 121 to the buffer layer 6 of the optical device wafer 2 under the changed irradiating conditions.

The pulsed laser beam 121 has a wavelength transmittable through the epitaxy substrate 4 of the composite substrate 1 and absorbable by the buffer layer 6 thereof, as described above. In the buffer layer breaking step 1002, the Ga compound of the buffer layer 6 that is irradiated with the pulsed laser beam 121 is decomposed and separated into bubbles of $N_2$ gas and a Ga layer of gallium. In the buffer layer breaking step 1002, the buffer layer 6 is thus broken, producing $N_2$ gas bubbles therein. The bubbles and other regions than the bubbles appear different in hue etc. from each other and hence can be distinguished from each other when viewed from the reverse side 11 of the epitaxy substrate 4.

(Optical Device Layer Relocating Step)

Figure 14:
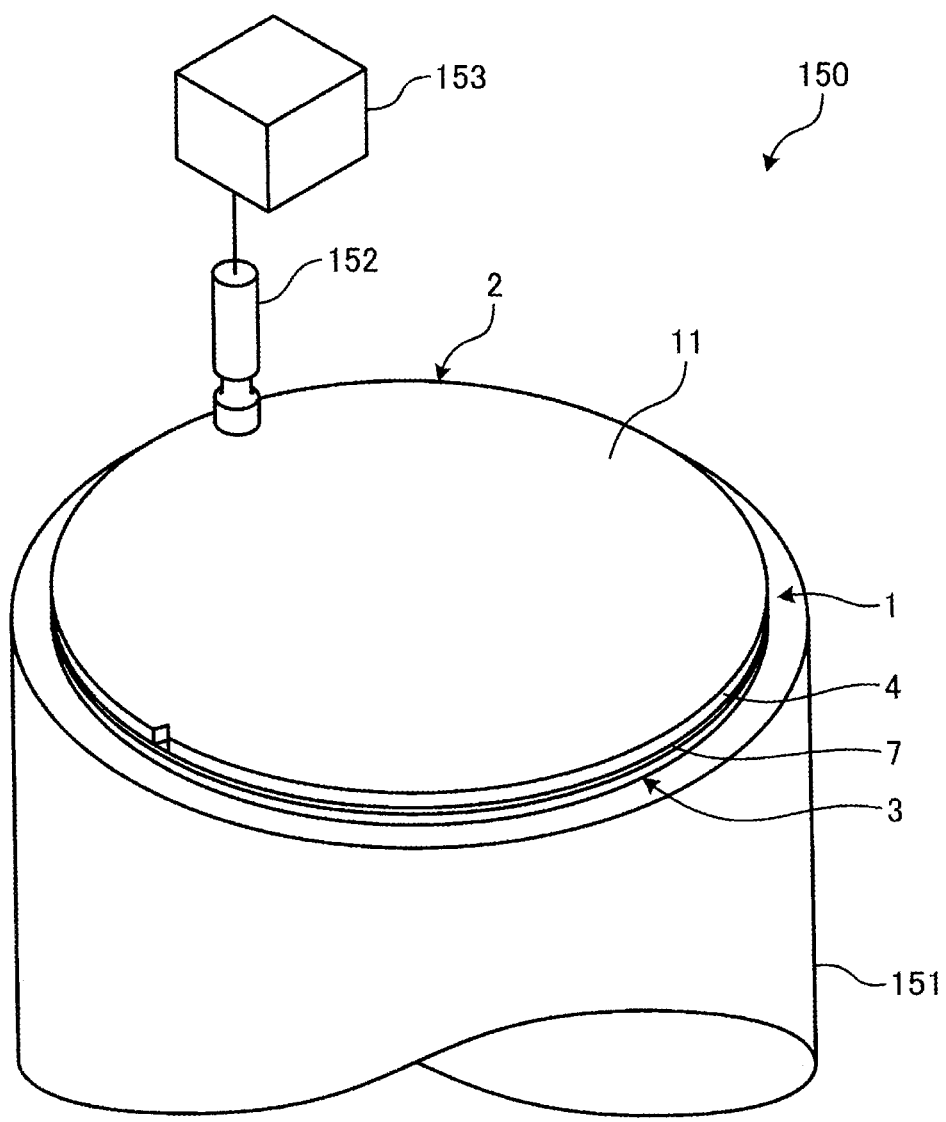
FIG. 14 is a perspective view schematically illustrating an optical device layer relocating step of the lift-off method illustrated in FIG. 6.

FIG. 14 schematically illustrates in perspective the optical device layer relocating step of the lift-off method illustrated in FIG. 6. The optical device layer relocating step 1003 is a step of peeling off the epitaxy substrate 4 from the optical device layer 7 and relocating the optical device layer 7 to the relocation substrate 3 after the buffer layer breaking step 1002 has been carried out.

In the optical device layer relocating step 1003, as illustrated in FIG. 14, the relocation substrate 3 of the composite substrate 1 is held on a holding table 151 of a relocation device 150, and an ultrasonic horn 152 is brought into contact with the reverse side 11 of the epitaxy substrate 4 of the composite substrate 1. In the optical device layer relocating step 1003, vibrating applying means 153 is actuated to apply ultrasonic vibrations to the ultrasonic horn 152, which then applies ultrasonic vibrations to the composite substrate 1. In the optical device layer relocating step 1003, therefore, the epitaxy substrate 4 is vibrated, starting to peel off from the optical device layer 7 at the broken buffer layer 6 as a peeling initiating point. In the optical device layer relocating step 1003, therefore, the epitaxy substrate 4 is thus removed from the composite substrate 1, relocating the optical device layer 7 to the relocation substrate 3.

In the lift-off method according to the first embodiment as described above, irradiating conditions are set respectively for the ring-shaped and circular areas 21-1, 21-2, and 21-3 whose outside diameters 22-1, 22-2, and 22-3 and inside diameters 23-1 and 23-2 have been designated. Consequently, even if the composite substrate 1 may have been warped, irradiating conditions for outer circumferential and central portions thereof can be changed to process the composite substrate 1 by applying thereto a pulsed laser beam 121 with optimum focused spots and output power levels. The lift-off method is thus able to reduce the period of time required to process the composite substrate 1 and also to reduce quality failures of products obtained from the composite substrate 1. As a result, the lift-off method according to the first embodiment is capable of achieving desired processed results and preventing a reduction in the quality of processed products.

Second Embodiment

Figure 15:
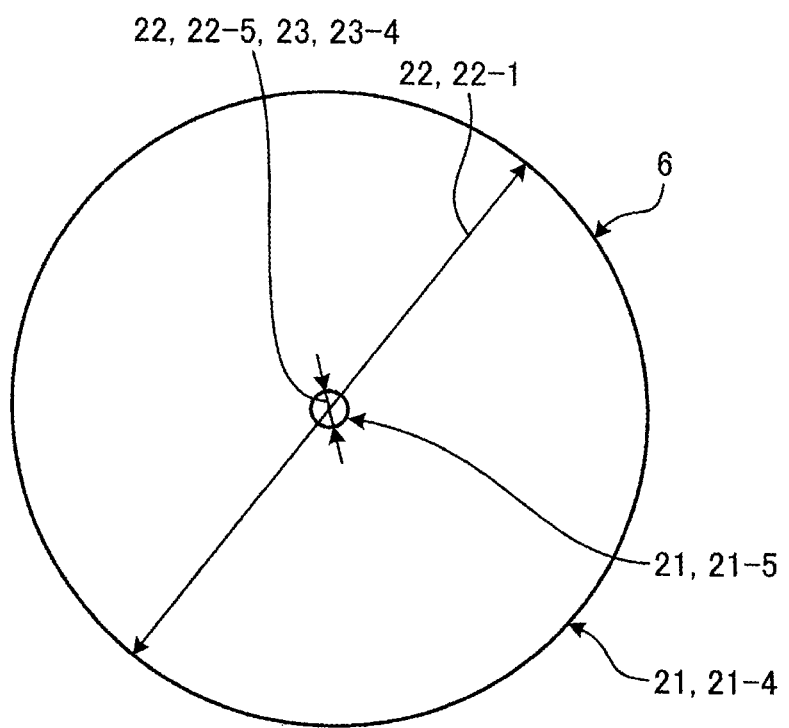
FIG. 15 is a plan view of a ring-shaped area set in the irradiated area setting section of the laser processing apparatus that carries out a buffer layer breaking step of a lift-off method according to a second embodiment of the present invention.

A laser processing apparatus and a lift-off method according to a second embodiment of the present invention will be described below. FIG. 15 illustrates in plan a ring-shaped area set in the irradiated area setting section of the laser processing apparatus that carries out a buffer layer breaking step of the lift-off method according to the second embodiment of the present invention. Those parts illustrated in FIG. 15 that are identical to those according to the first embodiment are denoted by identical reference characters, and will be omitted from description below.

The lift-off method according to the second embodiment is similar to the lift-off method according to the first embodiment except that the entire area irradiating step is not carried out, but the area irradiating step is carried out and different irradiating conditions are used in the area irradiating step. According to the second embodiment, in the buffer layer breaking step 1002, information indicating the execution of an area irradiating step of applying the pulsed laser beam 121 under different irradiating conditions to a plurality of the ring-shaped areas 21 of the buffer layer 6 is entered as the processing content information into the control unit 140, and the control unit 140 receives the entered information and stores the received information in the irradiated area setting section 143.

According to the second embodiment, the outside diameter 22-1 of the buffer layer 6 illustrated in FIG. 15 and a fourth inside diameter 23 (corresponding to an inside diameter and hereinafter denoted by 23-4) smaller than the outside diameter 22-1 of the buffer layer 6, the first inside diameter 23-1, and the second inside diameter 23-2 are entered as information of an area 21 in the area irradiating step of the buffer layer breaking step 1002 into the control unit 140, and a ring-shaped area 21 (illustrated in FIG. 15 and hereinafter referred to as "fourth area 21-4") defined between the outside diameter 22-1 and the fourth inside diameter 23-4 is set in the irradiated area setting section 143 of the control unit 140. According to the second embodiment, the outside diameter 22-1 of the buffer layer 6 is 101.6 mm, for example, and the fourth inside diameter 23-4 is 5.0 mm, for example.

The operator operates the input unit 142, for example, to enter irradiating conditions for the fourth area 21-4 in the area irradiating step into the control unit 140, and the control unit 140 receives the entered irradiating conditions and stores the received irradiating conditions as associated with the outside diameter 22-1 and fourth inside diameter 23-4 of the fourth area 21-4 in the irradiated area setting section 143. According to the second embodiment, the irradiating conditions for the fourth area 21-4 represent the output power level of the pulsed laser beam 121 in the range from 3 to 10 µJ, the index of the pulsed laser beam 121 in the range from 10 to 20 μm, and the defocus of the pulsed laser beam 121 in the range from 0 to 3.0 mm, for example.

According to the second embodiment, a fifth outside diameter 22 (corresponding to an outside diameter and hereinafter denoted by 22-5) equal to the fourth inside diameter 23-4 and a fifth inside diameter (corresponding to an inside diameter) smaller than the fifth outside diameter 22-5 are entered as information of an area 21 in the area irradiating step of the buffer layer breaking step 1002 into the control unit 140, and a circular area 21 (hereinafter referred to as "fifth area 21-5") defined by the fifth outside diameter 22-5 is set in the irradiated area setting section 143 of the control unit 140. According to the second embodiment, the fifth outside diameter 22-5 is 5.0 mm, for example, and the fifth inside diameter is 0 mm, for example. In the present description, the fifth area 21-5 is represented by a ring-shaped area whose inside diameter is zero.

The operator operates the input unit 142, for example, to enter irradiating conditions for the fifth area 21-5 in the area irradiating step into the control unit 140, and the control unit 140 receives the entered irradiating conditions and stores the received irradiating conditions as associated with the fifth outside diameter 22-5 of the fifth area 21-5 in the irradiated area setting section 143. According to the second embodiment, the irradiating conditions for the fifth area 21-5 represent the output power level of the pulsed laser beam 121 in the range from 1 to 5 μJ, the index of the pulsed laser beam 121 in the range from 10 to 20 μm, and the defocus of the pulsed laser beam 121 in the range from 0 to 3.0 mm, for example.

According to the second embodiment, the output power level of the pulsed laser beam 121 etc. of the irradiating conditions for the fifth area 21-5 is lower than the output power level of the pulsed laser beam 121 of the irradiating conditions for the fourth area 21-4 in the area irradiating step of the buffer layer breaking step 1002. According to the second embodiment, therefore, the output power level of the pulsed laser beam 121 etc. of the irradiating conditions for the radially inward fifth area 21-5 is lower than the output power level of the pulsed laser beam 121 of the irradiating conditions for the radially outer fourth area 21-4 in the area irradiating step of the buffer layer breaking step 1002.

In the buffer layer breaking step 1002, the laser processing apparatus 100 holds the relocation substrate 3 of the composite substrate 1 under suction on the holding surface 111 of the chuck table 110 and sets the focused spot 123 on the buffer layer 6, and the laser processing apparatus 100 applies the pulsed laser beam 121 to the buffer layer 6. According to the second embodiment, in the buffer layer breaking step 1002, the control unit 140 controls the mirror 125 to scan the pulsed laser beam 121 to initially position the focused spot 123 at the outermost circumferential edge of the epitaxy substrate 4 and then move the focused spot 123 on and along the spiral path 30. The control unit 140 also changes the irradiating conditions with respect to the pulsed laser beam 121 to the irradiating conditions for the areas 21-4 and 21-5 set in the irradiated area setting section 143 while the pulsed laser beam 121 is being scanned.

In the lift-off method according to the second embodiment as described above, irradiating conditions are set respectively for the ring-shaped and circular areas 21-4 and 21-5 whose outside diameters 22-1 and 22-5 and inside diameter 23-4 have been designated. Consequently, even if the composite substrate 1 may have been warped, irradiating conditions for outer circumferential and central portions thereof can be changed to process the composite substrate 1 by applying thereto a pulsed laser beam 121 with optimum focused spots and output power levels. The lift-off method is thus able to reduce the period of time required to process the composite substrate 1 and also to reduce quality failures of products obtained from the composite substrate 1. As a result, the lift-off method according to the second embodiment is capable of achieving desired processed results and preventing a reduction in the quality of processed products as is the case with the first embodiment.

Third Embodiment

Figure 16:
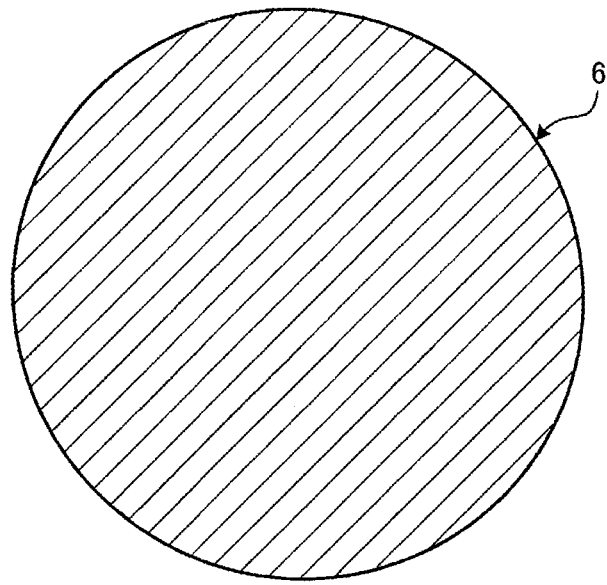
FIG. 16 is a plan view of a buffer layer after an entire area irradiating step of a buffer layer breaking step of a lift-off method according to a third embodiment of the present invention.
Figure 17:
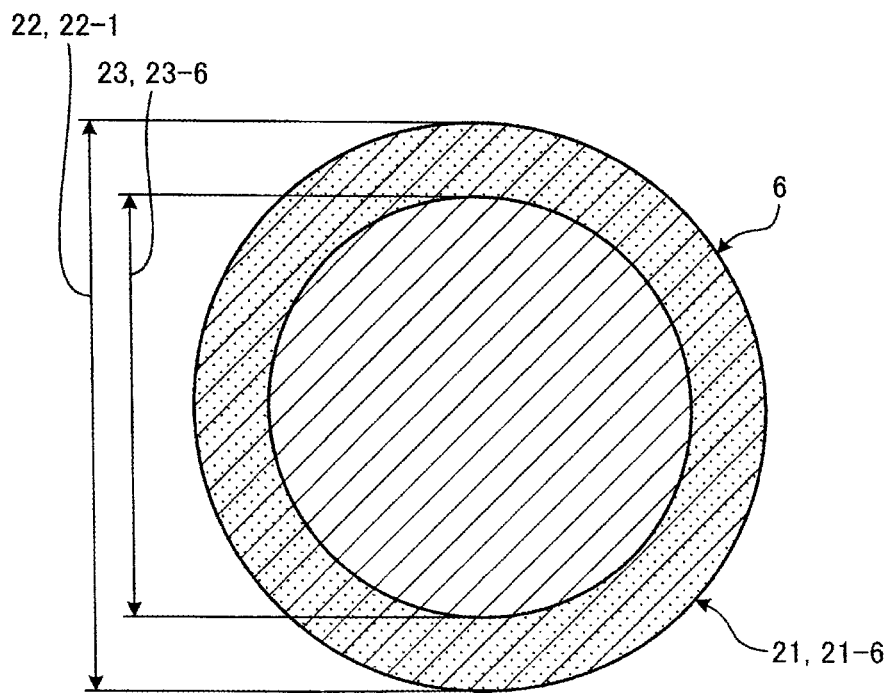
FIG. 17 is a plan view of the buffer layer after an area irradiating step of the buffer layer breaking step of the lift-off method according to the third embodiment.

A laser processing apparatus according to a third embodiment of the present invention will be described below. FIG. 16 illustrates in plan a buffer layer after an entire area irradiating step of a buffer layer breaking step of a lift-off method according to a third embodiment of the present invention. FIG. 17 illustrates in plan the buffer layer after an area irradiating step of the buffer layer breaking step of the lift-off method according to the third embodiment. Those parts illustrated in FIGS. 16 and 17 that are identical to those according to the first embodiment are denoted by identical reference characters, and will be omitted from description below.

The lift-off method according to the third embodiment is similar to the lift-off method according to the first embodiment except that the area irradiating step is carried out under different irradiating conditions in the area irradiating step of the buffer layer breaking step 1002. According to the third embodiment, in the buffer layer breaking step 1002, information indicating the execution of an entire area irradiating step and information indicating the execution of an area irradiating step is entered as the processing content information into the control unit 140, and the control unit 140 receives the entered information and stores the received information in the irradiated area setting section 143.

According to the third embodiment, in the buffer layer breaking step 1002, when the operator operates the input unit 142, for example, to set processing content information, the operator enters irradiating conditions with respect to the entire area irradiating step into the control unit 140, as is the case with the first embodiment, and the control unit 140 receives the entered irradiating conditions and stores the received irradiating conditions as associated with the entire area irradiating step in the irradiated area setting section 143.

According to the third embodiment, the outside diameter 22-1 of the buffer layer 6 and a sixth inside diameter 23 (corresponding to an inside diameter and hereinafter denoted by 23-6 in FIG. 17) smaller than the outside diameter 22-1 are entered as information of an area 21 in the area irradiating step into the control unit 140, and a ring-shaped area 21 (hereinafter referred to as "sixth area 21-6") defined between the outside diameter 22-1 and the sixth inside diameter 23-6 is set in the irradiated area setting section 143 of the control unit 140. According to the third embodiment, the operator operates the input unit 142, for example, to enter irradiating conditions for the sixth area 21-6 in the area irradiating step into the control unit 140, and the control unit 140 receives the entered irradiating conditions and stores the received irradiating conditions as associated with the outside diameter 22-1 and sixth inside diameter 23-6 of the sixth area 21-6 in the irradiated area setting section 143. According to the third embodiment, in the buffer layer breaking step 1002, since the pulsed laser beam 121 is applied to only the sixth area 21-6 in the area irradiating step after the entire area irradiating step, the output power level of the laser beam 121 etc. applied to an inner circumferential portion of the buffer layer 6 is lower than the output power level of the laser beam 121 etc. applied to an outer circumferential portion thereof.

In the buffer layer breaking step 1002, the laser processing apparatus 100 holds the relocation substrate 3 of the composite substrate 1 under suction on the holding surface 111 of the chuck table 110 and sets the focused spot 123 on the buffer layer 6, and the laser processing apparatus 100 applies the pulsed laser beam 121 to the buffer layer 6. According to the third embodiment, in the buffer layer breaking step 1002, the control unit 140 controls the mirror 125 to scan the pulsed laser beam 121 to initially position the focused spot 123 at the outermost circumferential edge of the epitaxy substrate 4 and then move the focused spot 123 on and along the spiral path 30, thereby applying the pulsed laser beam 121 to the buffer layer 6 in its entirety as hatched in FIG. 16 under the irradiating conditions with respect to the entire area irradiating step.

According to the third embodiment, in the buffer layer breaking step 1002, after the entire area irradiating step, the control unit 140 controls the mirror 125 to scan the pulsed laser beam 121 to initially position the focused spot 123 at the outermost circumferential edge of the epitaxy substrate 4 and then move the focused spot 123 on and along the spiral path 30. According to the third embodiment, in the buffer layer breaking step 1002, the laser processing apparatus 100 scans and applies the pulsed laser beam 121 to the sixth area 21-6 of the buffer layer 6 as stippled in FIG. 17 under the irradiating conditions for the sixth area 21-6 set in the irradiated area setting section 143. According to the third embodiment, when the laser processing apparatus 100 has applied the pulsed laser beam 121 to the sixth area 21-6 in the buffer layer breaking step 1002, the buffer layer breaking step 1002 comes to an end.

In the lift-off method according to the third embodiment, irradiating conditions are set for the ring-shaped area 21-6 whose outside diameter 22-1 and inside diameter 23-6 have been designated. Consequently, even if the composite substrate 1 may have been warped, irradiating conditions for outer circumferential and central portions thereof can be changed to process the composite substrate 1 by applying thereto a pulsed laser beam 121 with optimum focused spots and output power levels. The lift-off method is thus able to reduce the period of time required to process the composite substrate 1 and also to reduce quality failures of products obtained from the composite substrate 1. As a result, the lift-off method according to the third embodiment is capable of achieving desired processed results and preventing a reduction in the quality of processed products as is the case with the first embodiment.

(First Modification)

Figure 18:
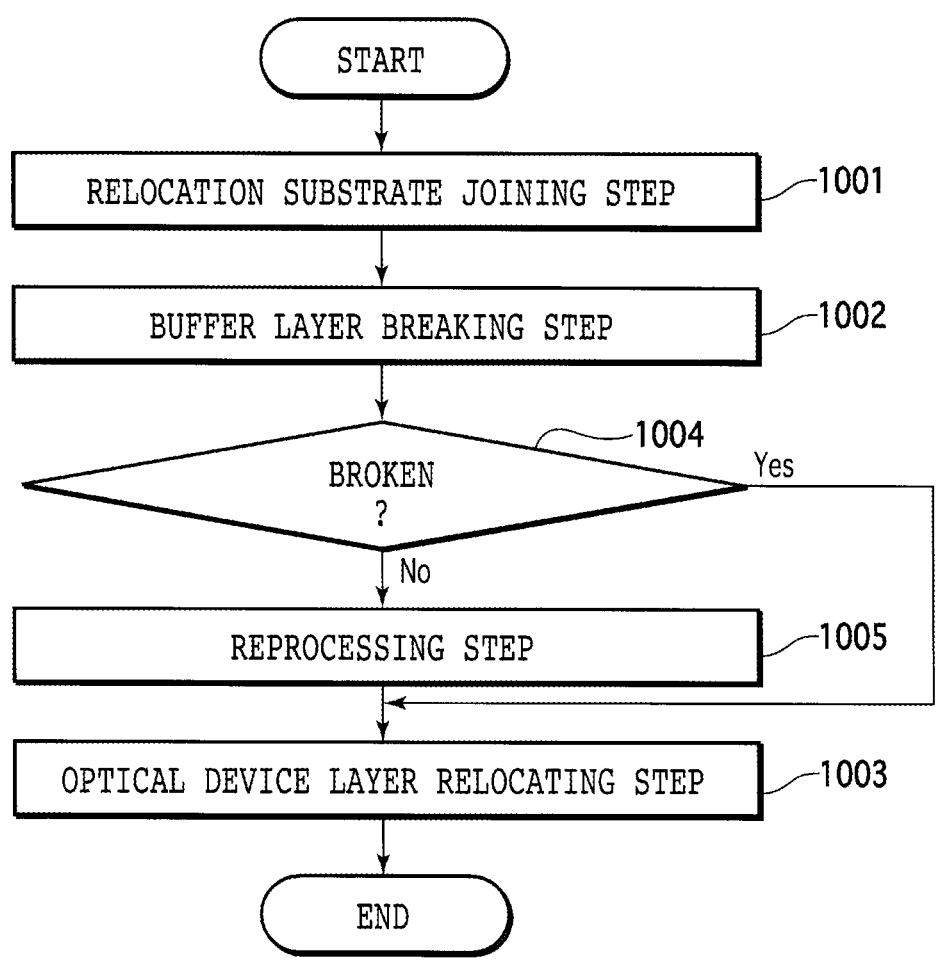
FIG. 18 is a flowchart of the sequence of a lift-off method according to a first modification of the first, second, and third embodiments.

A lift-off method according to a first modification of the first embodiment, the second embodiment, and the third embodiment will be described below. FIG. 18 is a flowchart of the sequence of a lift-off method according to the first modification of the first, second, and third embodiments. Those steps illustrated in FIG. 18 that are identical to those according to the first, second, and third embodiments are denoted by identical reference characters, and will be omitted from description below.

As illustrated in FIG. 18, the lift-off method according to the first modification is similar to the lift-off methods according to the first, second, and third embodiments except that it includes a confirming step 1004 and a reprocessing step 1005 in addition to the relocation substrate joining step 1001, the buffer layer breaking step 1002, and the optical device layer relocating step 1003.

The confirming step 1004 is a step of confirming, after the buffer layer breaking step 1002 has been carried out, whether or not the buffer layer 6 has been broken to the extent that makes the epitaxy substrate 4 able to peel off from the optical device layer 7 in the buffer layer breaking step 1002. In the confirming step 1004, the image capturing unit 130 captures an image of the composite substrate 1 in its entirety that is held on the chuck table 110. In the confirming step 1004, it is confirmed whether or not the buffer layer 6 has been broken to the extent that makes the epitaxy substrate 4 able to peel off from the optical device layer 7 by recognizing bubbles, for example, on the basis of the captured image of the composite substrate 1 in its entirety.

In the confirming step 1004, the operator may view the image of the composite substrate 1 in its entirety that is displayed on the display unit 141 to confirm whether or not the buffer layer 6 has been broken to the extent that makes the epitaxy substrate 4 able to peel off from the optical device layer 7. In the confirming step 1004, furthermore, the control unit 140 divides the image of the composite substrate 1 in its entirety into a plurality of preset zones, extracts bubbles in the zones, and calculates the ratios of the areas of the bubbles in the zones. In the confirming step 1004, the control unit 140 determines whether or not the calculated ratios of the areas of the bubbles in the zones are equal to or larger than a predetermined value, and the control unit 140 decides that the buffer layer 6 has been broken to the extent that allows the epitaxy substrate 4 to be peeled off from the optical device layer 7 if the ratios of the areas of the bubbles in all the zones are equal to or larger than the predetermined value. In the confirming step 1004, the control unit 140 decides that the buffer layer 6 has not been broken to the extent that allows the epitaxy substrate 4 to be peeled off from the optical device layer 7 if the ratio of the area of the bubbles in at least one of the zones is smaller than the predetermined value.

If it is decided that the buffer layer 6 has been broken to the extent that allows the epitaxy substrate 4 to be peeled off from the optical device layer 7 in the confirming step 1004 (Yes), then control goes to the optical device layer relocating step 1003. If it is decided that the buffer layer 6 has not been broken to the extent that allows the epitaxy substrate 4 to be peeled off from the optical device layer 7 in confirming step 1004 (No), then control goes to the reprocessing step 1005.

The reprocessing step 1005 is a step of applying the pulsed laser beam 121 again to the zones where the buffer layer 6 has been broken insufficiently. In the reprocessing step 1005, if the operator has viewed the image of the composite substrate 1 in its entirety that is displayed on the display unit 141 and confirmed that the buffer layer 6 has been broken insufficiently in the confirming step 1004, then the operator operates the input unit, for example, to enable the laser processing apparatus 100 to apply the pulsed laser beam 121 to the determined zones where the buffer layer 6 has been broken insufficiently. In the reprocessing step 1005, alternatively, if the control unit 140 has confirmed that the buffer layer 6 has been broken insufficiently on the basis of the image of the composite substrate 1 in its entirety that is displayed on the display unit 141, then the laser processing apparatus 100 applies the pulsed laser beam 121 to the zones where the ratios of the areas of the bubbles are smaller than the predetermined value, determining that the buffer layer 6 has been broken insufficiently.

In the lift-off method according to the first modification, irradiating conditions are set respectively for the ring-shaped and circular areas 21-1, 21-2, 21-3, 21-4, 21-5, and 21-6 whose outside diameters 22-1, 22-2, 22-3, and 22-5 and inside diameters 23-1, 23-2, 23-4, and 23-6 have been designated. Consequently, even if the composite substrate 1 may have been warped, irradiating conditions for outer circumferential and central portions thereof can be changed to process the composite substrate 1 by applying thereto a pulsed laser beam 121 with optimum focused spots and output power levels. The lift-off method is thus able to reduce the period of time required to process the composite substrate 1 and also to reduce quality failures of products obtained from the composite substrate 1. As a result, the lift-off method according to the first modification is capable of achieving desired processed results and preventing a reduction in the quality of processed products as is the case with the first embodiment.

Furthermore, as the lift-off method according to the first modification includes the confirming step 1004 and the reprocessing step 1005, and the reprocessing step 1005 is carried out in a case where the buffer layer 6 has been broken insufficiently after confirming whether or not the buffer layer 6 has been broken sufficiently, the buffer layer 6 can reliably be broken sufficiently, and the optical device layer 7 can be relocated without damage to the relocation substrate 3.

(Second Modification)

Figure 19:
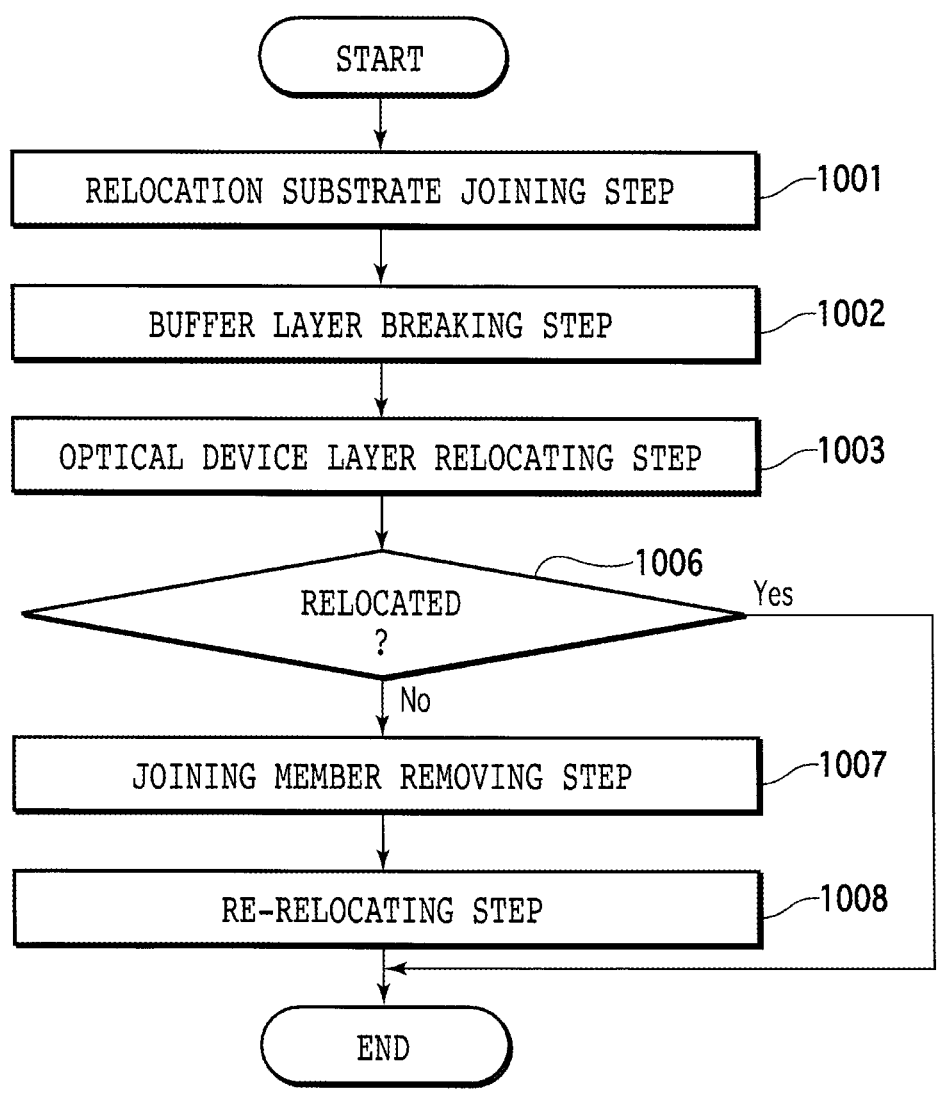
FIG. 19 is a flowchart of the sequence of a lift-off method according to a second modification of the first, second, and third embodiments.

A lift-off method according to a second modification of the first embodiment, the second embodiment, and the third embodiment will be described below. FIG. 19 is a flowchart of the sequence of a lift-off method according to the second modification of the first, second, and third embodiments. Those steps illustrated in FIG. 19 that are identical to those according to the first, second, and third embodiments are denoted by identical reference characters, and will be omitted from description below.

As illustrated in FIG. 19, the lift-off method according to the second modification is similar to the lift-off methods according to the first, second, and third embodiments except that it includes a joining member removing step 1007 to be carried out in a case where the optical device layer 7 has not been relocated to the relocation substrate 3 and a re-relocating step 1008 in addition to the relocation substrate joining step 1001, the buffer layer breaking step 1002, and the optical device layer relocating step 1003.

The joining member removing step 1007 is a step of removing a portion of the joining member 10 that protrudes from the outer edge of the epitaxy substrate 4 because the epitaxy substrate 4 and the relocation substrate 3 are considered to be joined to each other by the portion of the joining member 10 that protrudes from the outer edge of the epitaxy substrate 4 if the epitaxy substrate 4 is not removed from the composite substrate 1 and the optical device layer 7 is prevented from being relocated to the relocation substrate 3 (step S1006: No).

In the joining member removing step 1007, the laser processing apparatus 100 holds the relocation substrate 3 of the composite substrate 1 under suction on the holding surface 111 of the chuck table 110, receives processing content information for the joining member removing step 1007 that has been entered by the operator, and stores and sets the received processing content information in the irradiated area setting section 143. According to the second modification, information indicating the execution of a ring-shaped area irradiating step of applying the pulsed laser beam 121 to a ring-shaped area is entered as the processing content information set in the joining member removing step 1007 into the control unit 140, and the control unit 140 receives and stores the entered information.

In the joining member removing step 1007, when the operator operates the input unit 142, for example, to set processing content information, the operator enters the outside diameter of a ring-shaped area that represents a position for starting applying the pulsed laser beam 121 in the ring-shaped area irradiating step, the inside diameter of the ring-shaped area that represents a position for ending applying the pulsed laser beam 121 in the ring-shaped area irradiating step, and irradiating conditions into the control unit 140, and the control unit 140 receives the entered diameters and irradiating conditions and stores the ring-shaped area defined by the received outside and inside diameters as associated with the irradiating conditions.

According to the second modification, an outside diameter slightly larger than the outside diameter 22-1 of the buffer layer 6 and the outside diameter 22-1 of the buffer layer 6 as the inside side diameter of the ring-shaped area are entered as information of the ring-shaped area in the ring-shaped area irradiating step, and the ring-shaped area defined between the outside and inside diameters thus entered is set in the irradiated area setting section 143. The operator operates the input unit 142, for example, to enter irradiating conditions with respect to the ring-shaped area irradiating step into the control unit 140, and the control unit 140 receives the entered irradiating conditions and stores the received irradiating conditions as associated with the ring-shaped area. According to the second modification, the irradiating conditions for the ring-shaped area represent the output power level of the pulsed laser beam 121 in the range from 5 to 10 µJ, the index of the pulsed laser beam 121 in the range from 10 to 20 µm, and the defocus of the pulsed laser beam 121 in the range from 0 to 1.0 mm, for example.

In the joining member removing step 1007, the control unit 140 carries out the ring-shaped area irradiating step to apply the pulsed laser beam 121 under the set irradiating conditions in order to initially position the focused spot 123 at the outermost circumferential edge of the ring-shaped area and then move the focused spot 123 on and along a spiral path from the outermost circumferential edge of the ring-shaped area toward the inner edge thereof, thereby removing the portion of the joining member 10 that protrudes from the outer edge of the epitaxy substrate 4.

After the joining member removing step 1007 has been carried out, the re-relocating step 1008 is carried out. The re-relocating step 1008 is a step of relocating the optical device layer as is the case with the optical device layer relocating step 1003. After the re-relocating step 1008 has been carried out, the lift-off method is finished. In the optical device layer relocating step 1003, if the epitaxy substrate 4 is removed from the composite substrate 1 and the optical device layer 7 is relocated to the relocation substrate 3, then the lift-off method is finished. The lift-off method according to the second modification may include the confirming step 1004 and the reprocessing step 1005 as is the case with the first modification.

Since the lift-off method according to the second modification can process only the portion of the joining member 10 that protrudes from the outer edge of the epitaxy substrate 4, the lift-off method according to the second modification is advantageous in that the epitaxy substrate 4 can stably be peeled off from the optical device layer 7 without causing excessive damage thereto.

Moreover, inasmuch as the lift-off method according to the second modification includes the joining member removing step 1007 and the re-relocating step 1008, the lift-off method according to the second modification can relocate the optical device layer 7 without damage to the relocation substrate 3.

The present invention is not limited to the above embodiments. Stated otherwise, various changes and modifications may be made in the embodiments without departing from the scope of the present invention. In the above embodiments, in the buffer layer breaking step 1002, the output power level of the pulsed laser beam 121 etc. applied to the radially inward area of the buffer layer 6 is lower than the output power level of the pulsed laser beam 121 applied to the radially outer area of the buffer layer 6. The present invention is not limited to such details, but the output power level of the pulsed laser beam 121 etc. applied to the radially inward area of the buffer layer 6 may be higher than the output power level of the pulsed laser beam 121 applied to the radially outer area of the buffer layer 6.

According to the present invention, furthermore, the operator may initially confirm by way of visual inspection or the like whether or not the joining member 10 protrudes from the outer edge of the epitaxy substrate 4, and then the joining member removing step 1007 may be carried out to remove the protruding portion of the joining member 10, after which the buffer layer breaking step 1002 may be carried out to break the buffer layer 6.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A lift-off method for relocating an optical device layer of an optical device wafer in which the optical device layer is deposited on a face side of an epitaxy substrate with a buffer layer interposed therebetween to a relocation substrate, the lift-off method comprising:
   a relocation substrate joining step of joining the relocation substrate to a surface of the optical device layer of the optical device wafer with a joining member interposed therebetween to form a composite substrate;
   a buffer layer breaking step of applying a pulsed laser beam having a wavelength transmittable through the epitaxy substrate and absorbable by the buffer layer to the buffer layer from a reverse side of the epitaxy substrate of the optical device wafer of the composite substrate to break the buffer layer; and
   an optical device layer relocating step of, after the buffer layer breaking step has been carried out, peeling off the epitaxy substrate from the optical device layer to relocate the optical device layer to the relocation substrate,
   wherein, in the buffer layer breaking step, irradiating conditions of the pulsed laser beam are changed for respective ring-shaped areas of the buffer layer whose outside and inside diameters have been designated, and the pulsed laser beam is applied to the optical device wafer under the changed irradiating conditions.

* * * * *